United States Patent
Feng (10) Patent No.: US 10,348,215 B2
(45) Date of Patent: Jul. 9, 2019

(54) SUPPLY VOLTAGE GENERATING CIRCUIT AND ASSOCIATED INTEGRATED CIRCUIT

(71) Applicant: Chengdu Monolithic Power Systems Co., Ltd., Chengdu (CN)

(72) Inventor: Lin Feng, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/103,860

(22) Filed: Aug. 14, 2018

(65) Prior Publication Data
US 2019/0068074 A1 Feb. 28, 2019

(30) Foreign Application Priority Data
Aug. 23, 2017 (CN) .......................... 2017 1 0727591

(51) Int. Cl.
| | | |
|---|---|---|
| H02M 3/335 | (2006.01) | |
| H02M 7/217 | (2006.01) | |
| H02M 1/08 | (2006.01) | |
| H03K 4/08 | (2006.01) | |
| H03K 3/037 | (2006.01) | |
| H03K 17/00 | (2006.01) | |
| H02M 1/00 | (2006.01) | |
| H03K 19/20 | (2006.01) | |

(52) U.S. Cl.
CPC ............ H02M 7/217 (2013.01); H02M 1/08 (2013.01); H02M 3/33507 (2013.01); H03K 3/037 (2013.01); H03K 4/08 (2013.01); H03K 17/00 (2013.01); H02M 2001/0048 (2013.01); H03K 19/20 (2013.01)

(58) Field of Classification Search
CPC ......... H02M 7/217; H02M 2001/0048; H02M 1/08; H03K 3/037; H03K 4/08; H03K 19/20
See application file for complete search history.

(56) References Cited

U.S. PATENT DOCUMENTS

| | | | | |
|---|---|---|---|---|
| 8,854,838 B2 * | 10/2014 | Hara | ....................... | H02J 9/005 363/16 |
| 8,885,362 B2 * | 11/2014 | Kuang | ............... | H05B 33/0815 363/21.12 |
| 9,041,433 B2 * | 5/2015 | Ausseresse | .............. | H03K 3/01 327/109 |
| 9,343,971 B2 * | 5/2016 | Yedevelly | ......... | H02M 3/33507 |
| 9,722,599 B1 * | 8/2017 | Ivankovic | ................ | H03K 7/08 |
| 9,837,917 B1 * | 12/2017 | Furtner | ............. | H02M 3/33523 |

* cited by examiner

Primary Examiner — Kenneth B Wells
(74) Attorney, Agent, or Firm — Perkins Coie LLP (57) ABSTRACT

A supply voltage generating circuit for generating a supply voltage signal to supply the active elements of an AC-DC voltage converter. The supply voltage generating circuit has a charging switch, a charging diode and a charging capacitor. When a main switch of the AC-DC voltage converter is turned on, the charging switch is turned on. Primary current flows through the charging switch and the main switch to the logic ground. When the main switch is turned off and the voltage across the charging capacitor is smaller than a charging threshold, the charging switch is kept on for a period of time and the primary current flows through the charging switch and the charging diode to the charging capacitor. When the period of time is expired or the supply voltage signal is larger than the charging threshold signal, the charging switch is turned off.

18 Claims, 7 Drawing Sheets

SUPPLY VOLTAGE GENERATING CIRCUIT AND ASSOCIATED INTEGRATED CIRCUIT

CROSS-REFERENCE TO RELATED APPLICATION

This application claims the benefit of CN application No. 201710727591.6, filed on Aug. 23, 2017, and incorporated herein by reference.

TECHNICAL FIELD

The present invention generally relates to an electrical circuit, more particularly but not exclusively relates to supply voltage generating circuits and associated integrated circuits (ICs).

BACKGROUND

Figure 1:
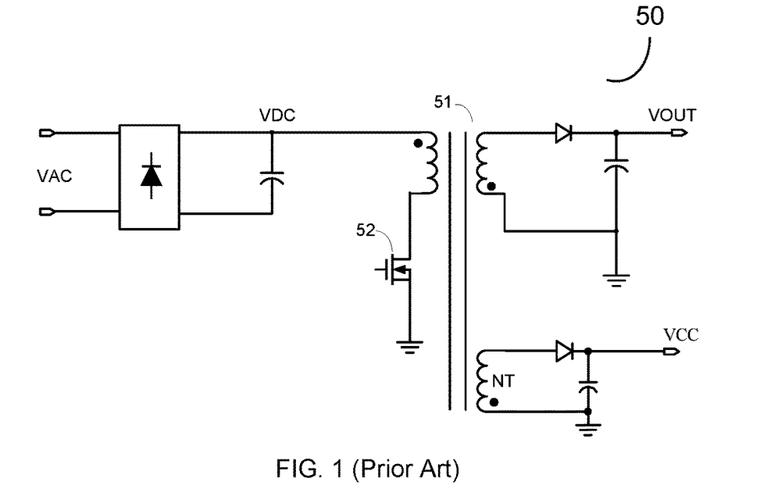
FIG. 1 schematically illustrates an AC-DC voltage converter 50 comprising a tertiary winding using for providing the supply voltage signal.

In power conversion applications, a supply voltage signal is necessary for supplying the active elements of a power converter, e.g., the drivers, clock generators, etc. In an AC-DC voltage converter, a tertiary winding is usually adapted to generate a supply voltage signal. FIG. 1 schematically illustrates an AC-DC voltage converter 50 comprising a tertiary winding for providing the supply voltage signal. As shown in FIG. 1, the AC-DC voltage converter 50 receives an AC input signal VAC which is converted to a DC voltage signal VDC of a primary winding of a transformer 51 through a rectifier and a filter capacitor. A main switch 52 is connected between the primary winding of the transformer 51 and a logic ground. The DC voltage signal VDC is further converted to an output voltage signal VOUT of a secondary primary winding of the transformer 51 through controlling the main switch 52 on and off. The transformer 51 further comprises a tertiary winding NT adapted to conduct the DC voltage signal VDC to generate a supply voltage signal VCC for supplying the active elements of the AC-DC voltage converter 50. Although adopting the tertiary winding NT to generate the supply voltage signal VCC of the AC-DC voltage converter 50 is efficient, the tertiary winding NT results in a high cost of the AC-DC voltage converter 50.

Therefore, it is desired to have a solution for efficiently generating the supply voltage signal without the tertiary winding in the AC-DC voltage converter.

SUMMARY

Embodiments of the present invention are directed to a supply voltage generating circuit for generating a supply voltage signal of an AC-DC voltage converter, wherein the AC-DC voltage converter comprises a transformer and a main switch, comprising: a charging switch, coupled between a primary winding of the transformer and the main switch; a charging diode, having an anode coupled to a common connection of the main switch and the charging switch, and a cathode coupled to an output terminal of the supply voltage generating circuit; a charging capacitor, connected between the output terminal of the supply voltage generating circuit and a logic ground, wherein the voltage across the charging capacitor is representative of a supply voltage signal; and a control module, wherein when the main switch is turned on, the control module is configured to turn the charging switch on, a primary current of the primary winding flows through the charging switch and the main switch to the logic ground, and wherein when the main switch is turned off and the supply voltage signal is smaller than a charging threshold signal, the control module is configured to keep the charging switch on for a period of time, and the primary current flows through the charging switch and the charging diode to the charging capacitor, and wherein when the period of time is expired or the supply voltage signal is larger than the charging threshold signal, the control module is configured to turn the charging switch off.

Embodiments of the present invention are further directed to an integrated circuit for generating a supply voltage signal of an AC-DC voltage converter, wherein the AC-DC voltage converter comprises a transformer, a charging capacitor, and a charging switch having a first terminal, a second terminal and a control terminal, comprising: an input pin, configured to receive a main control signal; an output pin, wherein the charging capacitor is coupled between the output pin and a logic ground; a switching pin, coupled to the first terminal of the charging switch, wherein the second terminal of the charging switch is coupled to a primary winding of the transformer; a control pin, coupled to the control terminal of the charging switch; a ground pin, connected to a logic ground; a main switch, having a first terminal coupled to the ground pin, a second terminal coupled to the switch pin, and a control terminal coupled to the input pin to receive the main control signal, wherein an input voltage signal of the AC-DC voltage converter is converted to an output voltage signal of the AC-DC voltage converter through controlling the main switch on and off; a charging diode, having an anode coupled to the switching pin, and a cathode coupled to the output pin; and a control module, wherein when the main switch is turned on, the control module is configured to turn the charging switch on, a primary current of the primary winding flows through the charging switch, the switching pin, the main switch and the ground pin to the logic ground, and wherein when the main switch is turned off and the supply voltage signal is smaller than a charging threshold signal, the control module is configured to keep the charging switch on for a period of time, and the primary current flows through the charging switch, the switching pin, the charging diode and the output pin to the charging capacitor, and wherein when the period of time is expired or the supply voltage signal is larger than the charging threshold signal, the control module is configured to turn the charging switch off.

BRIEF DESCRIPTION OF THE DRAWINGS

Non-limiting and non-exhaustive embodiments are described with reference to the following drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" includes direct connection and indirect connection. Indirect connection includes connection through conductor which has resistance and/or parasitic parameters such as inductance and capacitance, or connection through diode, and so on.

Figure 2:
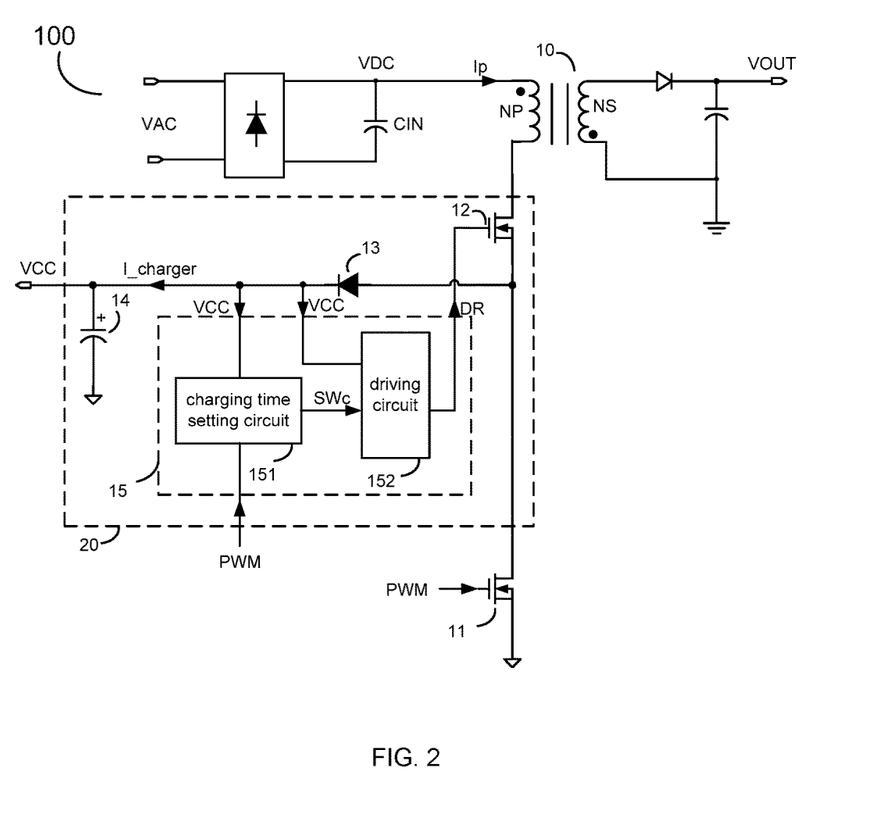
FIG. 2 schematically illustrates an AC-DC voltage converter 100 comprising a supply voltage generating circuit in accordance with an embodiment of the present invention.

FIG. 2 schematically illustrates an AC-DC voltage converter 100 comprising a supply voltage generating circuit 20 in accordance with an embodiment of the present invention. As shown in FIG. 2, the AC-DC voltage converter 100 may be configured to receive an AC input signal VAC which is converted to a DC voltage signal VDC through a rectifier and a filter capacitor CIN. The AC-DC voltage converter 100 comprises a main switch 11 and a transformer 10 having a primary winding NP and a secondary winding NS. The main switch 11 may be connected between the primary winding NP of the transformer 10 and a logic ground. A control signal PWM may be configured to control the main switch 11 on and off so as to convert the DC voltage signal VDC on the primary winding NP of the transformer 10 to an output voltage signal VOUT on the secondary winding NS of the transformer 10.

The main control signal PWM generated by a loop controller is a logic signal having a logic high state and a logic low state. In an embodiment, the logic high state is indicative of an active state of the main control signal PWM to turn the main switch 11 on, e.g., when the main control signal PWM is logic high, the main switch 11 is turned on. In other embodiment, the logic low state is indicative of the active state of the main control signal PWM to turn the main switch 11 on, e.g., when the main control signal PWM is logic low, the main switch 11 is turned on.

In the exemplary embodiment of FIG. 2, the AC-DC voltage converter 100 may further comprise a supply voltage generating circuit 20. The supply voltage generating circuit 20 may comprise a charging switch 12, a charging diode 13, a charging capacitor 14 and a control module 15. The charging switch 12 may be coupled between the primary winding NP of the transformer 10 and the main switch 11. An anode of the charging diode 13 may be coupled to a common connection of the main switch 11 and the charging switch 12, and a cathode of the charging diode 13 may be coupled to an output terminal of the supply voltage generating circuit 20. The charging capacitor 14 is connected between the output terminal of the supply voltage generating circuit 20 and the logic ground, wherein the voltage across the charging capacitor 14 is representative of a supply voltage signal VCC for supplying the active elements of the AC-DC voltage converter 100. The control module 15 may be configured to provide a driving signal DR to drive the charging switch 12 on and off. In an embodiment, when the main control signal PWM is in the active state (e.g., logic high), the main switch 11 is turned on by the main control signal PWM and the control module 15 may be configured to turn the charging switch 12 on so that a primary current IP of the transformer 10 may flow through the charging switch 12 and the main switch 11 to the logic ground. When the main control signal PWM is in the inactive state (e.g., logic low), the main switch 11 is turned off by the main control signal PWM and the control module 15 may be configured to compare the supply voltage signal VCC with a charging threshold. If the supply voltage signal VCC is smaller than the charging threshold, the control module 15 may be configured to keep the charging switch 12 on for a period of time, and the primary current IP may flow through the charging switch 12 and the charging diode 13 to the charging capacitor 14. During the period of time, the charging current of the charging capacitor 14 is marked as I_charger. When the period of time is expired or the supply voltage signal VCC is larger than the charging threshold, the control module 15 may be configured to turn the charging switch 12 off. In an embodiment, the period of time is predetermined and constant in each operation cycle of the AC-DC voltage converter 100. In an embodiment, the period of time is determined by the voltage of the supply voltage signal VCC, and varied according to changes in the supply voltage signal VCC of each operation cycle of the AC-DC voltage converter 100. When the state of the main control signal PWM is changed to the active state again, the operation process mentioned above may be repeated.

In the exemplary embodiment of FIG. 2, the control module 15 may comprise a charging time setting circuit 151 and a driving circuit 152. The charging time setting circuit 151 may be configured to receive the supply voltage signal VCC and the main control signal PWM, and further configured to generate a charging time signal SWc based on the supply voltage signal VCC and the main control signal PWM. The charging time signal SWc is configured to determine the on time of the charging switch 12, i.e., the charging time of the charging capacitor 14. The driving circuit 152 may be configured to receive the charging time signal SWc and the supply voltage signal VCC, and further configured to generate the driving signal DR based on the charging time signal SWc and the supply voltage signal VCC.

In the exemplary embodiment of FIG. 2, the AC-DC voltage converter 100 is illustrated to have a flyback topology. As can be appreciated, in other embodiment, the AC-DC voltage converter 100 may comprise other suitable topologies, such as forward topology, etc. Likewise, although both the main switch 11 and the charging switch 12 are illustrated as N-type Metal Oxide Semiconductor Field Effect Transistors ("NMOSFETs") in FIG. 2, in other embodiment, the main switch 11 and the charging switch 12 may comprise other suitable semiconductor devices such as P-type MOSFETs, Junction Field Effect Transistors ("JFETs"), Insulated Gate Bipolar Translators ("IGBTs"), etc. In an embodiment, the main switch 11 may comprise a low-voltage semiconductor device, e.g. a MOSFET with a low breakdown voltage of 30V, and the charging switch 12 may comprise a high-voltage semiconductor device, e.g. a MOSFET with a high breakdown voltage of 700V.

Figure 3:
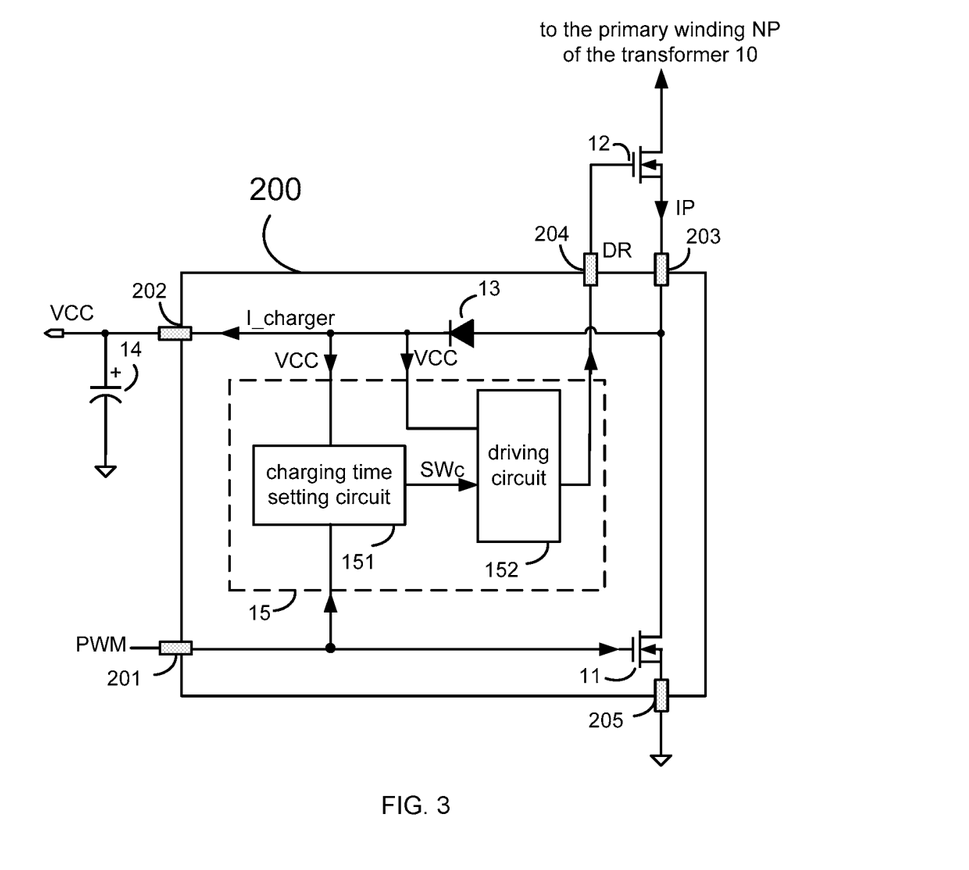
FIG. 3 schematically illustrates an IC 200 for generating the supply voltage signal VCC in accordance with an embodiment of the present invention.

In an embodiment, since the main switch 11 may be the low-voltage semiconductor device and the charging switch 12 may be the high-voltage semiconductor device, the main switch 11, the charging diode 13 and the control module 15 may be integrated in an integrated circuit (IC) while the charging switch 12 and the charging capacitor 14 may be arranged in the external of the IC. For example, in FIG. 3, an IC 200 for generating the supply voltage signal VCC is illustrated in accordance with an embodiment of the present invention. As shown in FIG. 3, the IC 200 may comprise an input pin 201 configured to receive the main control signal PWM, an output pin 202 configured to provide the charging current signal I_charger to charge the charging capacitor 14, a switching pin 203 coupled to a first terminal of the charging switch 12 which further comprises a second terminal coupled to the primary winding NP of the transformer 10, a control pin 204 coupled to a control terminal of the charging switch 12 to provide the driving signal DR, and a ground pin connected to the logic ground. The IC 200 may further comprise the main switch 11, the charging diode 13 and the control module 15. The main switch 11 may have a first terminal, a second terminal and a control terminal, wherein the first terminal of the main switch 11 may be coupled to the ground pin 205, the second terminal of the main switch 11 may be coupled to the switch pin 203, and the control terminal of the main switch 11 may be coupled to the input pin 201 to receive the main control signal PWM. The anode of the charging diode 13 may be coupled to the switching pin 203 and the cathode of the charging diode 13 may be coupled to the output pin 202. When the main switch 11 is turned on, the control module 15 may be configured to provide the driving signal DR at the control pin 204 to turn the charging switch 12 on. The primary current IP may flow through the charging switch 12, the switching pin 203, the main switch 11, and the ground pin 205 to the logic ground. When the main switch 11 is turned off, the control module 15 may be configured to compare the supply voltage signal VCC with the charging threshold. If the supply voltage signal VCC is smaller than the charging threshold, the control module 15 may be configured to keep the charging switch 12 on for a period of time, and the primary current IP may flow through the charging switch 12, the switching pin 203 and the charging diode 13 to the output pin 202 so as to charge the charging capacitor 14. When the period of time is expired or the supply voltage signal VCC is larger than the charging threshold, the control module 15 may be configured to turn the charging switch 12 off. In an embodiment, the period of time is predetermined and constant in each operation cycle of the AC-DC voltage converter 100. In an embodiment, the period of time is determined by the voltage of the supply voltage signal VCC, and varied according to changes in the supply voltage signal VCC of each operation cycle of the AC-DC voltage converter 100. The operation process of the IC 200 mentioned above may be repeated once the main switch 11 is turned on again.

Likewise, the control module 15 of the IC 200 may comprise the charging time setting circuit 151 and the driving circuit 152. The charging time setting circuit 151 may be configured to receive the supply voltage signal VCC and the main control signal PWM, and further configured to generate the charging time signal SWc based on the supply voltage signal VCC and the main control signal PWM. The charging time signal SWc is configured to determine the on time of the charging switch, i.e., the charging time of the charging capacitor 14. The driving circuit 152 may be configured to receive the charging time signal SWc and the supply voltage signal VCC, and further configured to generate the driving signal DR based on the charging time signal SWc and the supply voltage signal VCC.

Figure 4:
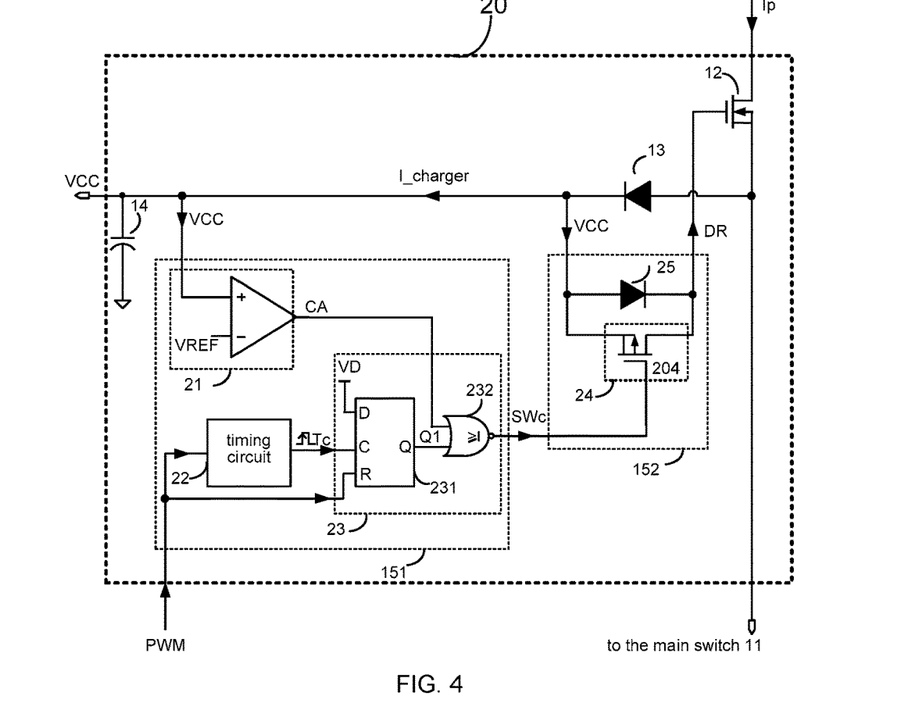
FIG. 4 schematically illustrates the supply voltage generating circuit 20 of FIG. 2 in accordance with an embodiment of the present invention.

FIG. 4 schematically illustrates the supply voltage generating circuit 20 of FIG. 2 in accordance with an embodiment of the present invention. As shown in FIG. 4, the supply voltage generating circuit 20 may comprise the charging switch 12, the charging diode 13, the charging capacitor 14 and the control module 15. The connection relationships of the charging switch 12, the charging diode 13, the charging capacitor 14 and the control module 15 have been described with reference to FIG. 2, and will not be described in detail again. The control module 15 may comprise the charging time setting circuit 151 and the driving circuit 152. In the exemplary embodiment of FIG. 4, the charging time setting circuit 151 may comprise a comparing circuit 21, a timing circuit 22 and a logic circuit 23.

The comparing circuit 21 may have a first input terminal configured to receive the supply voltage signal VCC, a second input terminal configured to receive a charging threshold signal VREF, and an output terminal. The comparing circuit 21 may be configured to compare the supply voltage signal VCC with the charging threshold signal VREF to generate a comparing signal CA at the output terminal of the comparing circuit 21. The comparing signal CA is a logic signal having a logic high state and a logic low state. In an embodiment, the comparing signal CA is in an active state when the supply voltage signal VCC is smaller than the charging threshold signal VREF, and the comparing signal CA is in an inactive state when the supply voltage signal VCC is larger than the charging threshold signal VREF. In an embodiment, the comparing circuit 21 may comprise a voltage comparator having a non-inverting terminal, an inverting terminal and an output terminal, wherein the non-inverting terminal of the voltage comparator is operated as the first input terminal of the comparing circuit 21, and the inverting terminal of the voltage comparator is operated as the second input terminal of the comparing circuit 21. In other embodiment, the comparing circuit 21 may comprise a hysteresis comparator.

The timing circuit 22 may be configured to receive the main control signal PWM. When the main control signal PWM is in the inactive state (e.g., logic low), the timing circuit 22 may start to operate to provide a timing signal Tc. In an embodiment, the timing circuit 22 may be configured to provide the timing signal Tc after the period of time. In such an application, the timing signal Tc may comprise a pulse signal with a narrow pulse width. In the exemplary embodiment of FIG. 4, the period of time set by the timing circuit 22 is predetermined and constant in each operation cycle of the AC-DC voltage converter 100.

The logic circuit 23 may be configured to receive the comparing signal CA, the timing signal Tc and the main control signal PWM, and further configured to conduct a logic operation to the comparing signal CA, the timing signal Tc and the main control signal PWM to generate the charging time signal SWc. In an embodiment, the logic circuit 23 may comprise a D flip-flop 231 and a NOR logic gate 232. the D flip-flop 231 may have an input terminal D configured to receive a high-level signal VD, a counting terminal C configured to receive the timing signal Tc, a reset terminal R configured to receive the main control signal PWM, and an output terminal Q configured to provide a logic signal Q1. The NOR logic gate 232 may have a first input terminal configured to receive the comparing signal CA, a second input terminal configured to receive the logic signal Q1, and an output terminal. The NOR logic gate 232 may be configured to conduct a logic operation to the comparing signal CA and the logic signal Q1 to generate the charging time signal SWc at the output terminal of the NOR logic gate 232.

In the exemplary embodiment of FIG. 4, the charging switch 12 may be configured to adopt a source driving method. Specifically, the driving circuit 152 may comprise a driving switch 24 and a driving diode 25. The driving switch 24 may have a first terminal coupled to the output terminal of the supply voltage generating circuit 20, a second terminal coupled to the control terminal of the charging switch 12, and a control terminal coupled to the charging time setting circuit 151 to receive the charging time signal SWc. In an embodiment, the driving switch 24 may comprise a P-type MOSFET 204, wherein the source of the P-type MOSFET 204 is coupled to the output terminal of the supply voltage generating circuit 20, the drain of the P-type MOSFET 204 is coupled to the control terminal of the charging switch 12, and the gate of the P-type MOSFET 204 is coupled to the charging time setting circuit 151 to receive the charging time signal SWc. An anode of the driving diode 25 is coupled to the output terminal of the supply voltage generating circuit 20, and a cathode of the driving diode 25 is coupled to the control terminal of the charging switch 12.

In an embodiment, when the main control signal PWM is in the active state (e.g., logic high), the main switch 11 is turned on while the D flip-flop 231 is reset by the main control signal PWM so as to inactivate the logic signal Q1 (e.g., logic low). The charging time signal SWc is activated to turn the driving switch 24 off. The supply voltage signal VCC may be applied on the control terminal of the charging switch 12 through the driving diode 25 to turn the charging switch 12 on. The primary current IP may flow through the charging switch 12 and the main switch 11 to the logic ground. When the state of the main control signal PWM is changed from the active state to the inactive state, the main switch 11 is turned off by the main control signal PWM. At meanwhile, the timing circuit 22 may start to operate. The driving switch 24 may be kept off. The charging switch 12 may continue to turn on for the period of time. The primary current IP may flow through the charging switch 12 and the charging diode 13 to the charging capacitor 14. The voltage on the gate of the charging switch 12 is held to be larger than the supply voltage VCC. Thus, the driving diode 25 is turned off. As the charging capacitor 14 is charged, the supply voltage signal VCC is increased. When the supply voltage signal VCC is raised to be larger than the charging threshold signal VREF or the period of time is expired, the state of the charging time signal SWc is changed from the active state to the inactive state so as to turn the driving switch 24 on. The voltage on the gate of the charging switch 12 may be pulled down to be equal to the supply voltage signal VCC. The charging switch 12 is turned off.

Figure 5:
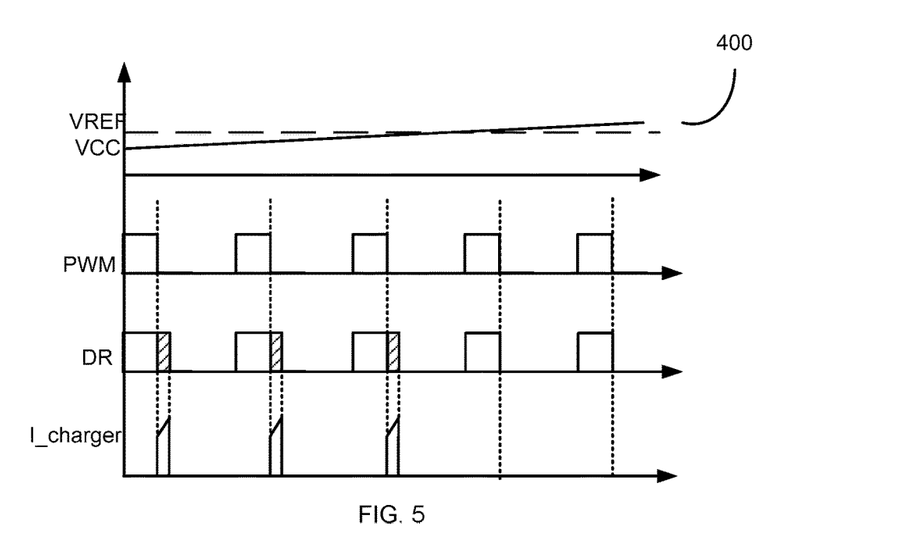
FIG. 5 schematically illustrates the waveform diagrams 400 of the supply voltage generating circuit 20 of FIG. 4 in accordance with an embodiment of the present invention.

FIG. 5 schematically illustrates the waveform diagrams 400 of the supply voltage generating circuit 20 of FIG. 4 in accordance with an embodiment of the present invention. In the exemplary embodiment of FIG. 5, the waveform diagrams 400 illustrates the charging threshold signal VREF, the supply voltage signal VCC, the main control signal PWM, the driving signal DR, and the charging current signal I_charger from top-to-bottom. As shown in FIG. 5, when the state of the main control signal PWM is changed from the logic high state to the logic low state and the supply voltage signal VCC is smaller than the charging threshold signal VREF, the driving signal DR may continue to keep on the logic high state for the period of time. Since the period of time is predetermined and constant, the value of the charging current signal I_charger in each cycle is the same.

Figure 6:
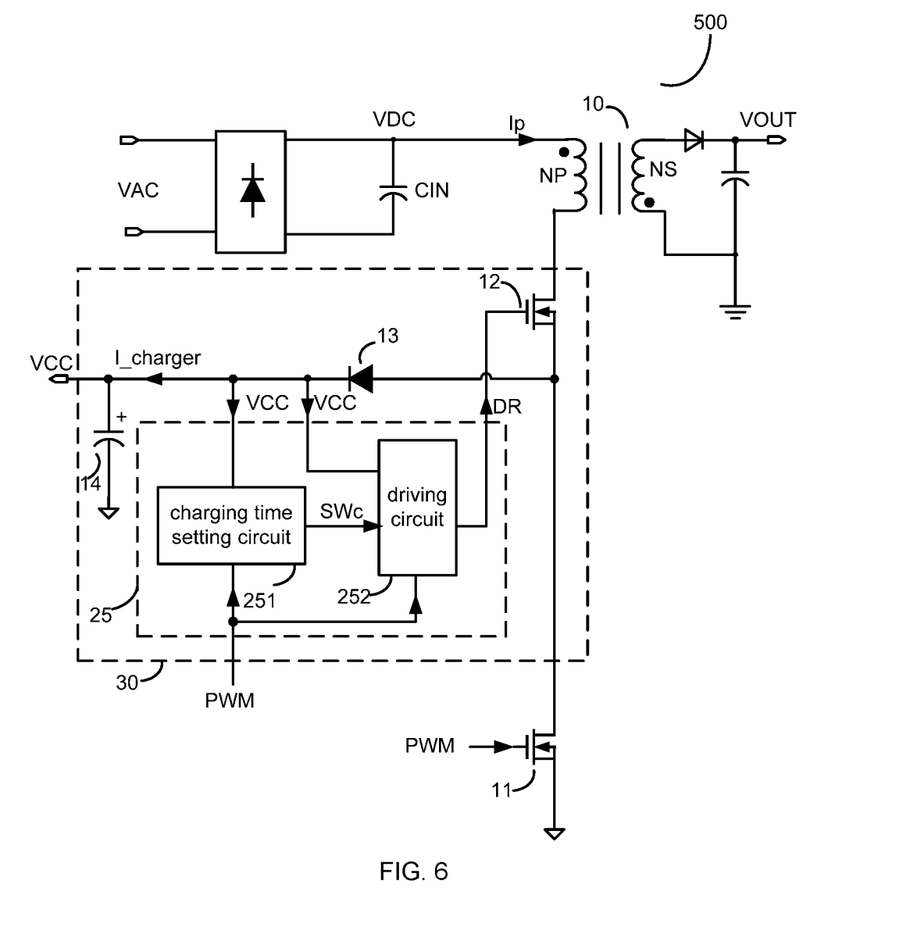
FIG. 6 schematically illustrates an AC-DC voltage converter 500 comprising a supply voltage generating circuit 30 in accordance with an embodiment of the present invention.

FIG. 6 schematically illustrates an AC-DC voltage converter 500 comprising a supply voltage generating circuit 30 in accordance with an embodiment of the present invention. Compared to the supply voltage generating circuit 20 of FIG. 2, the supply voltage generating circuit 30 may comprise a control module 25 different from the control module 15 of FIG. 2. As shown in FIG. 6, in detail, the control module 25 may comprise a charging time setting circuit 251 and a driving circuit 252. The charging time setting circuit 251 may be configured to receive the supply voltage signal VCC and the main control signal PWM, and further configured to generate a charging time signal SWc based on the supply voltage signal VCC and the main control signal PWM. The charging time signal SWc is configured to determine the on time of the charging switch 12, i.e, the charging time of the charging capacitor 14. The driving circuit 252 may be further configured to receive the main control signal PWM, and generate the driving signal DR based on the charging time signal SWc, the supply voltage signal VCC and the main control signal PWM. As similar as the AC-DC voltage converter 100 of FIG. 2, the main switch 11, the charging diode 13 and the control module 25 may be integrated in an IC while the charging switch 12 and the charging capacitor 14 may be arranged in the external of the IC.

Figure 7:
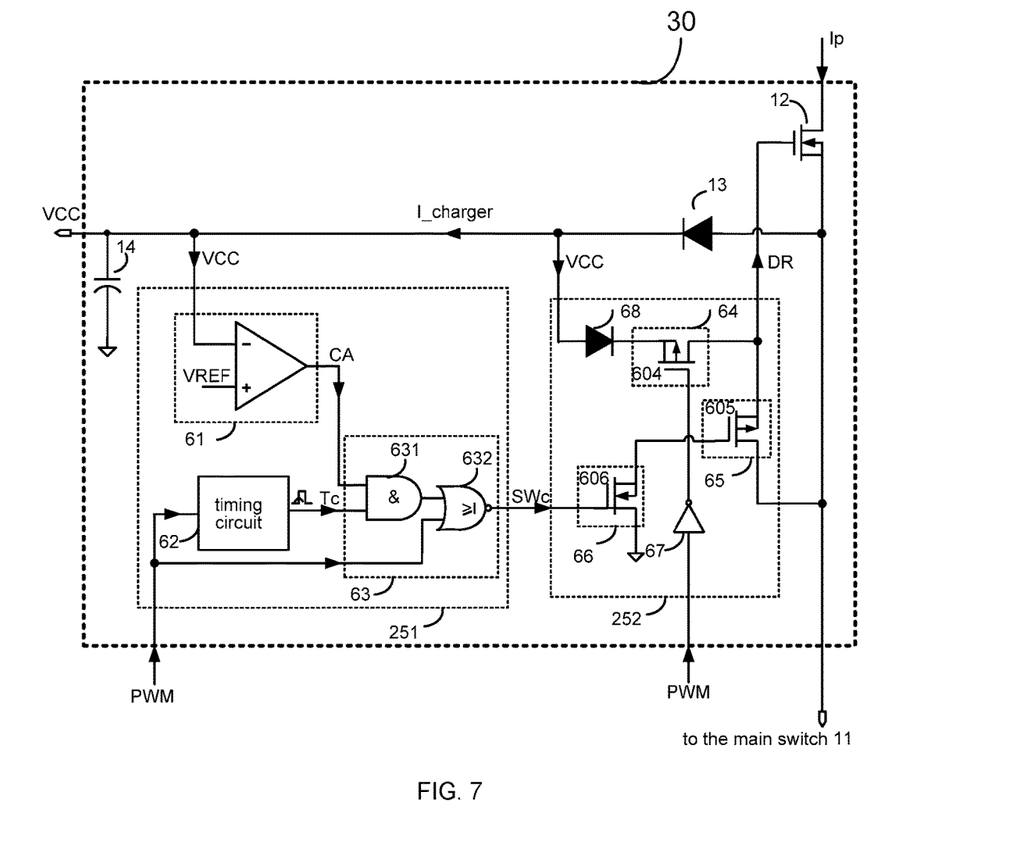
FIG. 7 schematically illustrates the supply voltage generating circuit 30 of FIG. 6 in accordance with an embodiment of the present invention.

FIG. 7 schematically illustrates the supply voltage generating circuit 30 of FIG. 6 in accordance with an embodiment of the present invention. As shown in FIG. 7, the control module 25 may comprise the charging time setting circuit 251 and the driving circuit 252. In the exemplary embodiment of FIG. 7, the charging time setting circuit 251 may comprise a comparing circuit 61, a timing circuit 62 and a logic circuit 63.

Similarly as the comparing circuit 21 of FIG. 4, the comparing circuit 61 may have a first input terminal configured to receive the supply voltage signal VCC, a second input terminal configured to receive a charging threshold signal VREF, and an output terminal. The comparing circuit 61 may be configured to compare the supply voltage signal VCC with the charging threshold signal VREF to generate the comparing signal CA at the output terminal of the comparing circuit 61. The comparing signal CA is a logic signal having a logic high state and a logic low state. In an embodiment, the comparing signal CA is in an active state when the supply voltage signal VCC is smaller than the charging threshold signal VREF, and the comparing signal CA is in an inactive state when the supply voltage signal VCC is larger than the charging threshold signal VREF. In an embodiment, the comparing circuit 61 may comprise a voltage comparator having a non-inverting terminal, an inverting terminal and an output terminal, wherein the non-inverting terminal of the voltage comparator is operated as the first input terminal of the comparing circuit 61, and the inverting terminal of the voltage comparator is operated as the second input terminal of the comparing circuit 61. In other embodiment, the comparing circuit 61 may comprise a hysteresis comparator.

The timing circuit 62 may be configured to receive the main control signal PWM. When the main control signal PWM is in the inactive state (e.g., logic low), the timing circuit 62 may start to operate and provide the timing signal Tc. In an embodiment, the timing signal Tc may comprise a logic signal having a logic high state and a logic low state. In an embodiment, the timing signal Tc is in the logic high state for the period of time, and the state of the timing signal Tc is changed to the logic low state when the period of time is expired. In the exemplary embodiment of FIG. 7, the period of time set by the timing circuit 62 is predetermined and constant in each operation cycle of the AC-DC voltage converter 100.

The logic circuit 63 may be configured to receive the comparing signal CA, the timing signal Tc and the main control signal PWM, and further configured to conduct a logic operation to the comparing signal CA, the timing signal Tc and the main control signal PWM to generate the charging time signal SWc. In an embodiment, the logic circuit 63 may comprise an AND logic gate 631 and a NOR logic gate 632. The AND logic gate 631 may have a first input terminal configured to receive the comparing signal CA, a second input terminal configured to receive the timing signal Tc, and an output terminal. The AND logic gate 631 may be configured to conduct a logic operation to the comparing signal CA and the timing signal Tc to generate an AND signal at the output terminal of the AND logic gate 631. The NOR logic gate 632 may have a first input terminal configured to receive the AND signal, a second input terminal configured to receive the main control signal, and an output terminal. The NOR logic gate 632 may be configured to conduct a logic operation to the AND signal and the main control signal PWM to generate the charging time signal SWc at the output terminal of the NOR logic gate 632.

In the exemplary embodiment of FIG. 7, the driving circuit 252 may comprise a first driving switch 64, a second driving switch 65, and a third driving switch 66.

The first driving switch 64 may comprise a first terminal coupled to the control terminal of the charging switch 12, a second terminal coupled to the output terminal of the supply voltage generating circuit 30, and a control terminal configured to receive the main control signal PWM. In an embodiment, the first driving switch 64 may comprise a P-type MOSFET 604, wherein the source of the P-type MOSFET 604 is coupled to the output terminal of the supply voltage generating circuit 30, the drain of the P-type MOSFET 604 is coupled to the control terminal of the charging switch 12. In such a situation, the gate of the P-type MOSFET 604 may be configured to receive the main control signal PWM through an inverter 67. In an embodiment, in order to prevent the control terminal of the charging switch 12 from connecting to the output terminal of the supply voltage generating circuit 30 through a parasitic diode of the first driving switch 64 after the first driving switch 64 is turned off, a driving diode 68 is connected between the first terminal of the first driving switch 64 and the output terminal of the supply voltage generating circuit 30, wherein an anode of the driving diode 68 is connected to the output terminal of the supply voltage generating circuit 30 and a cathode of the driving diode 68 is connected to the first terminal of the first driving switch 64.

The second driving switch 65 may comprise a first terminal coupled to the common connection of the charging switch 12 and the main switch 11, a second terminal coupled to the first terminal of the first driving switch 64, and a control terminal. In an embodiment, the second driving switch 65 may comprise a P-type MOSFET 605, wherein the drain of the P-type MOSFET 605 is coupled to the common connection of the charging switch 12 and the main switch 11, the source of the P-type MOSFET 605 is coupled to the first terminal of the first driving switch 64.

The third driving switch 66 may comprise a first terminal coupled to the control terminal of the second driving switch 65, a second terminal connected to the logic ground, and a control terminal coupled to the output terminal of the charging time setting circuit 251 to receive the charging time signal SWc. In an embodiment, the third driving switch 66 may comprise a N-type MOSFET 606, wherein the drain of the N-type MOSFET 606 is connected to the logic ground, the source of the N-type MOSFET 606 is coupled to the control terminal of second driving switch 65, and the gate of the N-type MOSFET 606 is coupled to the output terminal of the charging time setting circuit 251 to receive the charging time signal SWc.

In the exemplary embodiment of FIG. 7, when the main control signal PWM is in the active state (e.g., logic high), both the main switch 11 and the first driving switch 64 are turned on and the supply voltage signal VCC may be applied on the control terminal of the charging switch 12 through the driving diode 68 and the first driving switch 64 to turn the charging switch 12 on. The primary current IP may flow through the charging switch 12 and the main switch 11 to the logic ground. When the state of the main control signal PWM is changed from the active state to the inactive state, both the main switch 11 and the first driving switch 64 may be turned off by the main control signal PWM. The primary current IP may flow through the charging switch 12 and the charging diode 13 to the charging capacitor 14 for the period of time. At meanwhile, the timing circuit 62 starts to operate to provide the timing signal Tc. As the charging capacitor 14 is charged, the value of the supply voltage signal VCC is increased. When the supply voltage signal VCC is raised to be larger than the charging threshold signal VREF or the period of time is expired, the charging time signal SWc may be configured to turn the third driving switch 66 on so as to turn the second driving switch 65 on. The gate and the source of the charging switch 12 have a short connection to turn the charging switch 12 off.

Figure 8:
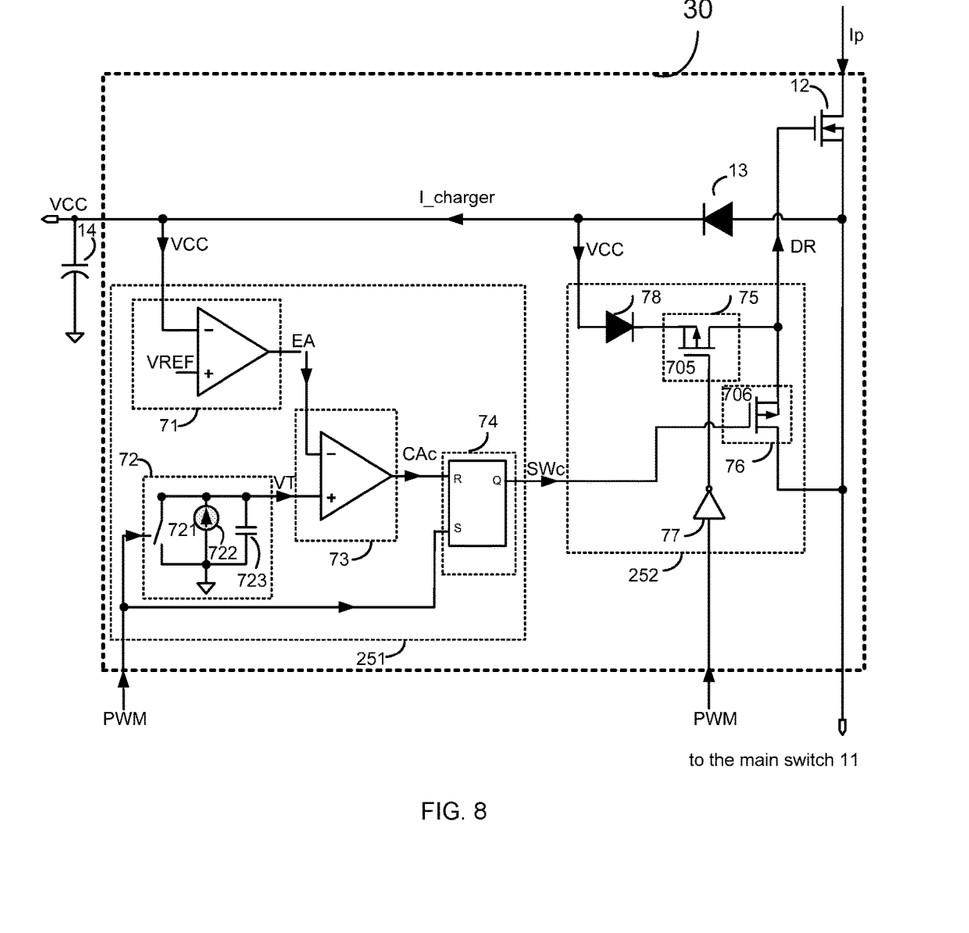
FIG. 8 schematically illustrates the supply voltage generating circuit 30 of FIG. 6 in accordance with an embodiment of the present invention.

FIG. 8 schematically illustrates a supply voltage generating circuit 30 of the FIG. 6 in accordance with an embodiment of the present invention. As shown in FIG. 8, the control module 25 may comprise the charging time setting circuit 251 and the driving circuit 252. In the exemplary embodiment of FIG. 8, the charging time setting circuit 251 may comprise an error amplifying circuit 71, a ramp generator 72, a charging comparing circuit 73 and a logic circuit 74.

The error amplifying circuit 71 may comprise a first input terminal configured to receive the supply voltage signal VCC, a second input terminal configured to receive the charging threshold signal VREF, and an output terminal. The error amplifying circuit 71 may be configured to compare the supply voltage signal VCC with the charging threshold signal VREF to generate an error signal EA at the output terminal of the error amplifying circuit 71. In an embodiment, the error amplifying circuit 71 may comprise a voltage error amplifying circuit having a non-inverting terminal, an inverting terminal and an output terminal, wherein the non-inverting terminal of the voltage error amplifying circuit is operated as the first input terminal of the error amplifying circuit 71, and the inverting terminal of the voltage error amplifying circuit is operated as the second input terminal of the error amplifying circuit 71.

The ramp generator 72 may be configured to receive the main control signal PWM. When the main control signal PWM is in the inactive state (e.g., logic low), the ramp generator 72 may start to operate to provide a ramp signal VT. In the exemplary embodiment of FIG. 8, the ramp generator 72 may comprise a switch 721, a current source 722 and a capacitor 723. The switch 721, the current source 722 and the capacitor 723 may be connected in parallel. When the main control signal PWM is active (e.g., logic high), the switch 721 is turned on, and the capacitor 723 is discharged to the logic ground through the switch 721. When the main control signal PWM is inactive (e.g., logic low), the switch 721 is turned off, the capacitor 723 is charged by the current source 722. The voltage across the capacitor 723 is indicative of the ramp signal VT.

The charging comparing circuit 73 may comprise a first input terminal configured to receive the error signal EA, a second input terminal configured to receive the ramp signal VT, and an output terminal. The charging comparing circuit 73 may be configured to compare the error signal EA with the ramp signal VT to generate a comparing signal CAc at the output terminal of the charging comparing circuit 73. The comparing signal CAc is configured to determine the on time of the charging switch 12 during the main switch 11 is turned off, i.e., the charge time of the charging capacitor 14. In an embodiment, when the error signal EA is larger than the ramp signal VT, the charging switch 12 is turned on to charge the charging capacitor 14. When the error signal EA is decreased to be equal to the ramp signal VT, the charging switch 12 is turned off. The on time of the charging switch 12 during the main switch 11 is turned off is varied according to changes in the error signal EA indicative of the supply voltage signal VCC in each operation cycle of the AC-DC voltage converter.

The logic circuit 74 may be configured to receive the comparing signal CAc and the main control signal PWM, and further configured to conduct a logic operation to the comparing signal CAc and the main control signal PWM to generate the charging time signal SWc. In an embodiment, the logic circuit 74 may comprise a RS flip-flop having a set terminal S configured to receive the main control signal PWM, a reset terminal R configured to receive the comparing signal CAc, and an output terminal Q. The RS flip-flop may be configured to conduct a logic operation to the comparing signal CAc and the main control signal PWM to generate the charging time signal SWc.

In the exemplary embodiment of FIG. 8, the driving circuit 252 may comprise a fourth driving switch 75 and a fifth driving switch 76.

The fourth driving switch 75 may comprise a first terminal coupled to the control terminal of the charging switch 12, a second terminal coupled to the output terminal of the supply voltage generating circuit 30, and a control terminal configured to receive the main control signal PWM. In an embodiment, the fourth driving switch 75 may comprise a P-type MOSFET 705, wherein the source of the P-type MOSFET 705 is coupled to the output terminal of the supply voltage generating circuit 30, the drain of the P-type MOSFET 705 is coupled to the control terminal of the charging switch 12. In such a situation, the gate of the P-type MOSFET 705 may be configured to receive the main control signal PWM through an inverter 77. In an embodiment, in order to prevent the control terminal of the charging switch 12 from connecting to the output terminal of the supply voltage generating circuit 30 through a parasitic diode of the fourth driving switch 75 after the fourth driving switch 75 is turned off, a driving diode 78 may be connected between the first terminal of the fourth driving switch 75 and the output terminal of the supply voltage generating circuit 30, wherein an anode of the driving diode 78 is connected to the output terminal of the supply voltage generating circuit 30 and a cathode of the driving diode 78 is connected to the first terminal of the fourth driving switch 75.

The fifth driving switch 76 may comprise a first terminal coupled to the common connection of the charging switch 12 and the main switch 11, a second terminal coupled to the first terminal of the fourth driving switch 75, and a control terminal configured to receive the charging time signal SWc. In an embodiment, the fifth driving switch 76 may comprise a P-type MOSFET 706, wherein the drain of the P-type MOSFET 706 is coupled to the common connection of the charging switch 12 and the main switch 11, the source of the P-type MOSFET 706 is coupled to the first terminal of the fourth driving switch 75, and the gate of the P-type MOSFET 706 receives the charging time signal SWc.

In the exemplary embodiment of FIG. 8, when the main control signal PWM is active (e.g., logic high), both the main switch 11 and the forth driving switch 75 are turned on and the supply voltage signal VCC may be applied on the control terminal of the charging switch 12 through the driving diode 78 and the forth driving switch 75 so as to turn the charging switch 12 on. The primary current IP flows through the charging switch 12 and the main switch 11 to the logic ground. When the state of the main control signal PWM is changed from the active state to the inactive state, both the main switch 11 and the forth driving switch 75 may be turned off. The charging switch 12 may keep in the on state and the primary current IP flows through the charging switch 12 and the charging diode 13 to the charging capacitor 14. At meanwhile, the ramp generator 72 may start to operate to generate the ramp signal VT. When the error signal EA is smaller than the ramp signal VT, the logic circuit 74 may reset the charging time signal SWc so as to turn the fifth driving switch 76 on. The gate and the source of the charging switch 12 have a short connection to turn off the charging switch 12.

Figure 9:
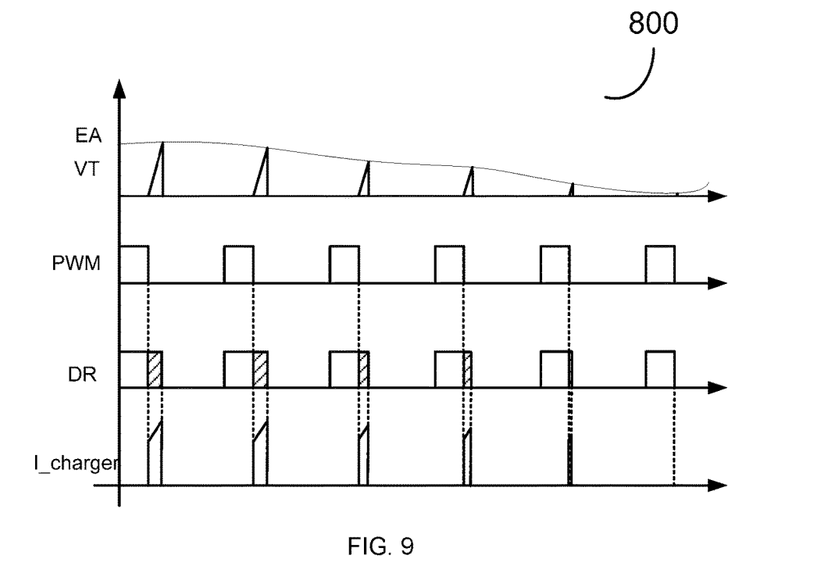
FIG. 9 schematically illustrates the waveform diagrams 800 of the supply voltage generating circuit 30 of FIG. 8 in accordance with an embodiment of the present invention.

FIG. 9 schematically illustrates the waveform diagrams 800 of the supply voltage generating circuit 30 of FIG. 8 in accordance with an embodiment of the present invention. In the exemplary embodiment of FIG. 9, the waveform diagrams 800 illustrates the error signal EA, the ramp signal VT, the main control signal PWM, the driving signal DR, and the charging current signal I_charger from top-to-bottom. As shown in FIG. 9, when the main control signal PWM is changed from the logic high state to the logic low state and the error signal EA is larger than the ramp signal VT, the driving signal DR may be held in the logic high state to keep the charging switch 12 on. Compared to the waveform diagrams 400 of FIG. 5, the charging time of the charging capacitor 14 of each cycle of FIG. 9 is varied in the error signal EA. It should be noted that, in the embodiment of FIG. 9, while the logic high state of the driving signal DR is illustrated to have the same voltage, in the actual operation, the voltage of the logic high state of the driving signal DR may be increased during the charging period of the charging capacitor 14, which is also certified and presented in the simulation waveform of the driving signal DR of FIG. 10.

Figure 10:
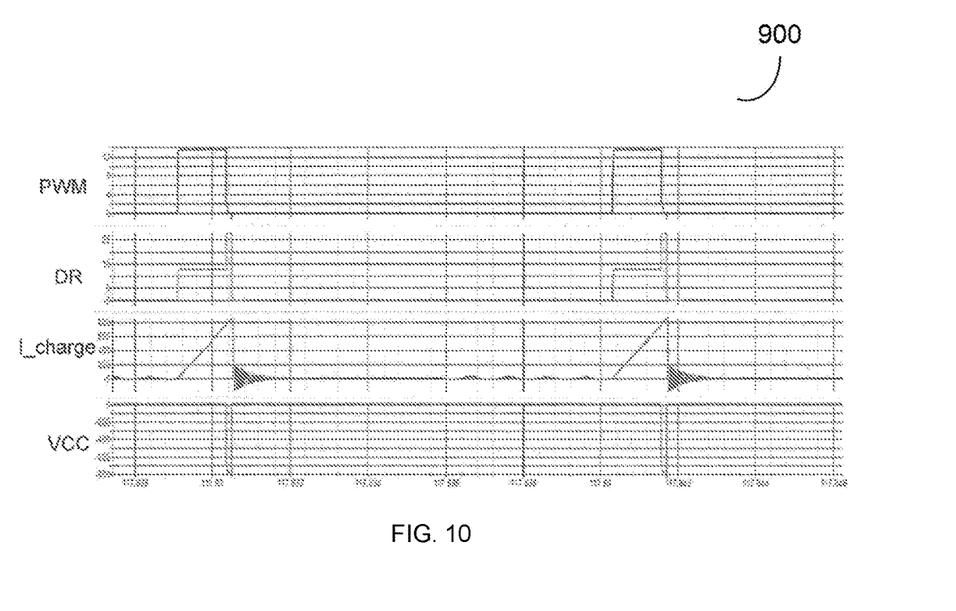
FIG. 10 schematically illustrates the simulation waveforms diagram 900 of the supply voltage generating circuit in accordance with an embodiment of the present invention.

FIG. 10 schematically illustrates the simulation waveform diagrams 900 of the supply voltage generating circuit in accordance with an embodiment of the present invention. In the exemplary embodiment of FIG. 10, the simulation waveforms 900 illustrates the main control signal PWM, the driving signal DR, the charging current signal I_charger, and the supply voltage signal VCC from top-to-bottom.

Obviously, many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

I claim:

1. A supply voltage generating circuit for generating a supply voltage signal of an ac-dc voltage converter, wherein the ac-dc voltage converter comprises a transformer and a main switch, the supply voltage generating circuit comprising:
   a charging switch, coupled between a primary winding of the transformer and the main switch;
   a charging diode, having an anode coupled to a common connection of the main switch and the charging switch, and a cathode coupled to an output terminal of the supply voltage generating circuit;
   a charging capacitor, connected between the output terminal of the supply voltage generating circuit and a logic ground, wherein the voltage across the charging capacitor is representative of the supply voltage signal; and
   a control module, wherein when the main switch is turned on, the control module is configured to turn the charging switch on, a primary current of the primary winding flows through the charging switch and the main switch to the logic ground, and wherein when the main switch is turned off and the supply voltage signal is smaller than a charging threshold signal, the control module is configured to keep the charging switch on for a period of time, and the primary current flows through the charging switch and the charging diode to the charging capacitor, and wherein when the period of time is expired or the supply voltage signal is larger than the charging threshold signal, the control module is configured to turn the charging switch off.

2. The supply voltage generating circuit of claim 1, wherein the period of time is predetermined and constant in each operation cycle of the ac-dc voltage converter.

3. The supply voltage generating circuit of claim 1, wherein the period of time is varied according to changes in the supply voltage signal of each operation cycle of the ac-dc voltage converter.

4. The supply voltage generating circuit of claim 1, wherein the control module comprises:
   a charging time setting circuit, configured to receive the supply voltage signal and a main control signal, and further configured to generate a charging time signal based on the supply voltage signal and the main control signal, wherein the charging time signal is configured to determine the period of time, and wherein the main control signal is configured to control the main switch, and the main switch is turned off once the main control signal is in an inactive state, and wherein an input voltage signal of the ac-dc voltage converter is converted to an output voltage signal of the ac-dc voltage converter through controlling the main switch on and off; and
   a driving circuit, configured to receive the charging time signal and the supply voltage signal, and further configured to generate a driving signal to drive the charging switch on and off.

5. The supply voltage generating circuit of claim 4, wherein the charging time setting circuit comprises:
   a first comparing circuit, having a first input terminal configured to receive the supply voltage signal, a second input terminal configured to receive the charging threshold signal, and an output terminal, wherein the first comparing circuit is configured to compare the supply voltage signal with the charging threshold signal to generate a first comparing signal at the output terminal of the first comparing circuit;
   a timing circuit, configured to receive the main control signal, wherein when the main control signal is in the inactive state, the timing circuit configured to start to operate to provide a timing signal; and
   a first logic circuit, configured to receive the first comparing signal, the timing signal and the main control signal, and further configured to conduct a logic operation to the first comparing signal, the timing signal and the main control signal to generate the charging time signal.

6. The supply voltage generating circuit of claim 4, wherein the charging time setting circuit comprises:
   an error amplifying circuit, having a first input terminal configured to receive the supply voltage signal, a second input terminal configured to receive the charging threshold signal, and an output terminal, wherein the error amplifying circuit is configured to compare the supply voltage signal with the charging threshold signal to generate an error signal at the output terminal of the error amplifying circuit;
   a ramp generator, configured to receive the main control signal, wherein when the main control signal is in the inactive state, the ramp generator configured to start to operate to provide a ramp signal;
   a second comparing circuit, having a first input terminal configured to receive the error signal, a second input terminal configured to receive the ramp signal, and an output terminal, wherein the second comparing circuit is configured to compare the error signal with the ramp signal to generate a second comparing signal at the output terminal of the second comparing circuit; and
   a second logic circuit, configured to receive the second comparing signal and the main control signal, and further configured to conduct a logic operation to the second comparing signal and the main control signal to generate the charging time signal.

7. The supply voltage generating circuit of claim 5, wherein the first logic circuit comprises:
   a D flip-flop, having an input terminal configured to receive a high-level signal, a counting terminal configured to receive the timing signal, a reset terminal configured to receive the main control signal, and an output terminal configured to provide a first logic signal; and a first NOR logic gate, having a first input terminal configured to receive the comparing signal, a second input terminal configured to receive the first logic signal, and an output terminal, wherein the first NOR logic gate is configured to conduct a logic operation to the comparing signal and the first logic signal to generate the charging time signal at the output terminal of the first NOR logic gate.

8. The supply voltage generating circuit of claim 5, wherein the first logic circuit comprises:
   an AND logic gate, having a first input terminal configured to receive the comparing signal, a second input terminal configured to receive the timing signal, and an output terminal, wherein the AND logic gate is configured to conduct a logic operation to the comparing signal and the logic signal to generate a second logic signal at the output terminal of the AND logic gate; and
   a second NOR logic gate, having a first input terminal configured to receive the second logic signal, a second input terminal configured to receive the main control signal, and an output terminal, wherein the second NOR logic gate is configured to conduct a logic operation to the second logic signal and the main control signal to generate the charging time signal at the output terminal of the second NOR logic gate.

9. The supply voltage generating circuit of claim 6, wherein the second logic circuit comprises a RS flip-flop having a set terminal configured to receive the main control signal, a reset terminal configured to receive the comparing signal, and an output terminal, and wherein the RS flip-flop is configured to conduct a logic operation to the comparing signal and the main control signal to generate the charging time signal.

10. The supply voltage generating circuit of claim 6, wherein the ramp generator comprises:
    a ramp switch, having a first terminal coupled to the second input terminal of the second comparing circuit, a second terminal connected to the logic ground, and a control terminal configured to receive the main control signal;
    a current source, connected between the second input terminal of the second comparing circuit and the logic ground; and
    a ramp capacitor, connected between the second input terminal of the second comparing circuit and the logic ground, wherein the voltage across the ramp capacitor is representative of the ramp signal.

11. The supply voltage generating circuit of claim 4, wherein the driving circuit comprises:
    a driving switch, having a first terminal coupled to the output terminal of the supply voltage generating circuit, a second terminal coupled to the control terminal of the charging switch, and a control terminal coupled to the charging time setting circuit to receive the charging time signal; and
    a driving diode, having an anode coupled to the output terminal of the supply voltage generating circuit, and a cathode coupled to the control terminal of the charging switch.

12. The supply voltage generating circuit of claim 4, wherein the driving circuit is further configured to receive the main control signal, and generate the driving signal based on the charging time signal, the supply voltage signal and the main control signal, and wherein the driving circuit comprises:
    a first driving switch, having a first terminal coupled to the control terminal of the charging switch, a second terminal coupled to the output terminal of the supply voltage generating circuit, and a control terminal configured to receive the main control signal; and
    a second driving switch, having a first terminal coupled to the common connection of the charging switch and the main switch, a second terminal coupled to the first terminal of the first driving switch, and a control terminal configured to receive the charging time signal.

13. The supply voltage generating circuit of claim 4, wherein the driving circuit is further configured to receive the main control signal, and generate the driving signal based on the charging time signal, the supply voltage signal and the main control signal, and wherein the driving circuit comprises:
    a first driving switch, having a first terminal coupled to the control terminal of the charging switch, a second terminal coupled to the output terminal of the supply voltage generating circuit, and a control terminal configured to receive the main control signal;
    a second driving switch, having a first terminal coupled to the common connection of the charging switch and the main switch, a second terminal coupled to the first terminal of the first driving switch, and a control terminal; and
    a third driving switch, having a first terminal coupled to the control terminal of the second driving switch, a second terminal connected to the logic ground, and a control terminal configured to receive the charging time signal.

14. An integrated circuit for generating a supply voltage signal of an ac-dc voltage converter, wherein the ac-dc voltage converter comprises a transformer, a charging capacitor and a charging switch, comprising:
    an input pin, configured to receive a main control signal;
    an output pin, wherein the charging capacitor is coupled between the output pin and a logic ground;
    a switching pin, coupled to a first terminal of the charging switch, wherein a second terminal of the charging switch is coupled to a primary winding of the transformer;
    a control pin, coupled to a control terminal of the charging switch;
    a ground pin, connected to a logic ground;
    a main switch, having a first terminal coupled to the ground pin, a second terminal coupled to the switch pin, and a control terminal coupled to the input pin to receive the main control signal, wherein an input voltage signal of the ac-dc voltage converter is converted to an output voltage signal of the ac-dc voltage converter through controlling the main switch on and off;
    a charging diode, having an anode coupled to the switching pin, and a cathode coupled to the output pin; and
    a control module, wherein when the main switch is turned on, the control module is configured to turn the charging switch on, a primary current of the primary winding flows through the charging switch, the switching pin, the main switch and the ground pin to the logic ground, and wherein when the main switch is turned off and the supply voltage signal is smaller than a charging threshold signal, the control module is configured to keep the charging switch on for a period of time, and the primary current flows through the charging switch, the switching pin, the charging diode and the output pin to the charging capacitor, and wherein when the period of time is expired or the supply voltage signal is larger than the charging threshold signal, the control module is configured to turn the charging switch off.

15. The integrated circuit of claim 14, wherein the period of time is predetermined and constant in each operation cycle of the ac-dc voltage converter.

16. The integrated circuit of claim 14, wherein the period of time is varied according to changes in the supply voltage signal of each operation cycle of the ac-dc voltage converter.

17. The integrated circuit of claim 14, wherein the control module comprises:
- a charging time setting circuit, configured to receive the supply voltage signal and the main control signal, and further configured to generate a charging time signal based on the supply voltage signal and the main control signal, wherein the charging time signal is configured to determine the period of time; and
- a driving circuit, configured to receive the charging time signal and the supply voltage signal, and further configured to generate a driving signal based on the charging time signal and the supply voltage signal to drive the charging switch on and off.

18. The integrated circuit of claim 14, wherein the control module comprises:
- a charging time setting circuit, configured to receive the supply voltage signal and a main control signal, and further configured to generate a charging time signal based on the supply voltage signal and the main control signal, wherein the charging time signal is configured to determine the period of time; and
- a driving circuit, configured to receive the charging time signal, the supply voltage signal and the main control signal, and further configured to generate a driving signal based on the charging time signal, the supply voltage signal and the main control signal to drive the charging switch on and off.

* * * * *